US012560243B2

(12) United States Patent
Naik et al.

(10) Patent No.: US 12,560,243 B2
(45) Date of Patent: Feb. 24, 2026

(54) CENTER FEED SYMMETRIC FLOW VALVE FOR PLASMA CHAMBERS

(71) Applicant: Applied Materials, Inc., Santa Clara, CA (US)

(72) Inventors: Chetan Ramachandra Naik, Bengaluru (IN); Anand Kumar, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 111 days.

(21) Appl. No.: 18/225,673

(22) Filed: Jul. 24, 2023

(65) Prior Publication Data

US 2025/0035215 A1      Jan. 30, 2025

(51) Int. Cl.
| | |
|---|---|
| *F16K 51/02* | (2006.01) |
| *F16K 1/36* | (2006.01) |
| *F16K 1/42* | (2006.01) |
| *F16K 11/04* | (2006.01) |
| *F16K 27/02* | (2006.01) |
| *H01J 37/18* | (2006.01) |

(52) U.S. Cl.
CPC .................. *F16K 1/36* (2013.01); *F16K 1/42* (2013.01); *F16K 11/04* (2013.01); *F16K 27/02* (2013.01); *F16K 51/02* (2013.01); *H01J 37/18* (2013.01); *H01J 2237/186* (2013.01); *Y10T 137/86759* (2015.04)

(58) Field of Classification Search
CPC ... F16K 1/36; F16K 1/42; F16K 11/04; F16K 51/02; Y10T 137/86759
See application file for complete search history.

(56) References Cited

U.S. PATENT DOCUMENTS

| | | | | |
|---|---|---|---|---|
| 2,214,250 A | * | 9/1940 | Landrum .................. | F16K 3/24 |
| | | | | 251/117 |
| 3,810,486 A | * | 5/1974 | Gutekunst ............... | F16K 27/00 |
| | | | | 137/625.33 |
| 6,189,519 B1 | * | 2/2001 | Press ....................... | F16K 47/04 |
| | | | | 123/568.21 |
| 6,863,256 B2 | * | 3/2005 | Lucas ....................... | F16K 3/10 |
| | | | | 251/193 |

(Continued)

FOREIGN PATENT DOCUMENTS

WO      WO-2021180699 A1  *  9/2021   .............. F04C 28/24

*Primary Examiner* — Kevin F Murphy
(74) *Attorney, Agent, or Firm* — Moser Taboada

(57) ABSTRACT

Embodiments of symmetric flow valves for use in substrate processing chambers are provided herein. In some embodiments, a symmetric flow valve includes: a valve body having sidewalls, a bottom plate, and a top plate that together define an interior volume, wherein the top plate includes a plurality of axisymmetrically disposed openings arranged in a non-linear manner, and wherein the bottom plate includes a port opening; an actuator disposed above the top plate and coupled to a central region of the top plate radially inward of the plurality of axisymmetrically disposed openings; and a poppet disposed in the interior volume and coupled to the actuator to move the poppet vertically within the interior volume, wherein the poppet is configured to selectively seal the plurality of axisymmetrically disposed openings or the port opening.

19 Claims, 5 Drawing Sheets

(56) References Cited

U.S. PATENT DOCUMENTS

| | | | |
|---|---|---|---|
| 8,051,870 B2 * | 11/2011 | Matsuura | F16K 51/02 |
| | | | 137/15.04 |
| 9,206,919 B2 * | 12/2015 | Neumeister | F16K 27/02 |
| 9,429,248 B2 * | 8/2016 | Merry | F16K 51/00 |
| 9,530,623 B2 * | 12/2016 | Merry | H01J 37/32449 |
| 9,932,976 B2 * | 4/2018 | Cavatorta | F04B 37/14 |
| 10,559,451 B2 * | 2/2020 | Kalnin | H01J 37/32715 |
| 11,199,267 B2 | 12/2021 | Nguyen et al. | |
| 2017/0069466 A1 | 3/2017 | Tran et al. | |
| 2018/0233327 A1 | 8/2018 | Kalnin et al. | |
| 2020/0049278 A1 * | 2/2020 | Hosek | F16K 31/0693 |

* cited by examiner

CENTER FEED SYMMETRIC FLOW VALVE FOR PLASMA CHAMBERS

FIELD

Embodiments of the present disclosure generally relate to substrate processing equipment.

BACKGROUND

Substrate processing chambers generally are coupled to a vacuum system having a vacuum pump to exhaust the substrate processing chamber. A symmetric flow valve is disposed between the vacuum pump and the processing chamber to regulate pressure and flow in the processing chamber. However, the inventors have found that existing flow valves in substrate processing chambers promote non-symmetric flow along a vertical axis, facilitate unwanted particle deposits, and are hard to service.

Accordingly, the inventors have provided embodiments of improved symmetric flow valves.

SUMMARY

Embodiments of symmetric flow valves for use in substrate processing chambers are provided herein. In some embodiments, a symmetric flow valve includes: a valve body having sidewalls, a bottom plate, and a top plate that together define an interior volume, wherein the top plate includes a plurality of axisymmetrically disposed openings arranged in a non-linear manner, and wherein the bottom plate includes a port opening; an actuator disposed above the top plate and coupled to a central region of the top plate radially inward of the plurality of axisymmetrically disposed openings; and a poppet disposed in the interior volume and coupled to the actuator to move the poppet vertically within the interior volume, wherein the poppet is configured to selectively seal the plurality of axisymmetrically disposed openings or the port opening.

In some embodiments, a symmetric flow valve for use in a substrate processing chamber includes: a valve body having sidewalls, a bottom plate, and a top plate that together define an interior volume, wherein the top plate includes a plurality of axisymmetrically disposed openings arranged in a non-linear manner, and wherein the bottom plate includes a port opening; an actuator disposed above the top plate and coupled to a central region of the top plate radially inward of the plurality of axisymmetrically disposed openings; and a poppet disposed in the interior volume and coupled to a shaft of the actuator at a center of the poppet to move the poppet vertically within the interior volume, wherein the poppet is configured to selectively seal the plurality of axisymmetrically disposed openings or the port opening.

In some embodiments, a substrate processing chamber includes: a chamber body having a floor, wherein the floor includes a plurality of chamber openings; a valve body having sidewalls, a bottom plate, and a top plate that together define an interior volume, wherein the top plate includes a plurality of axisymmetrically disposed openings arranged in a non-linear manner corresponding with the plurality of chamber openings, and wherein the bottom plate includes a port opening; an actuator disposed above the top plate and coupled to a central region of the top plate radially inward of the plurality of axisymmetrically disposed openings; and a poppet disposed in the interior volume and coupled to the actuator to move the poppet vertically within the interior volume, wherein the poppet is configured to selectively seal the plurality of axisymmetrically disposed openings or the port opening; and a pump coupled to the port opening.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
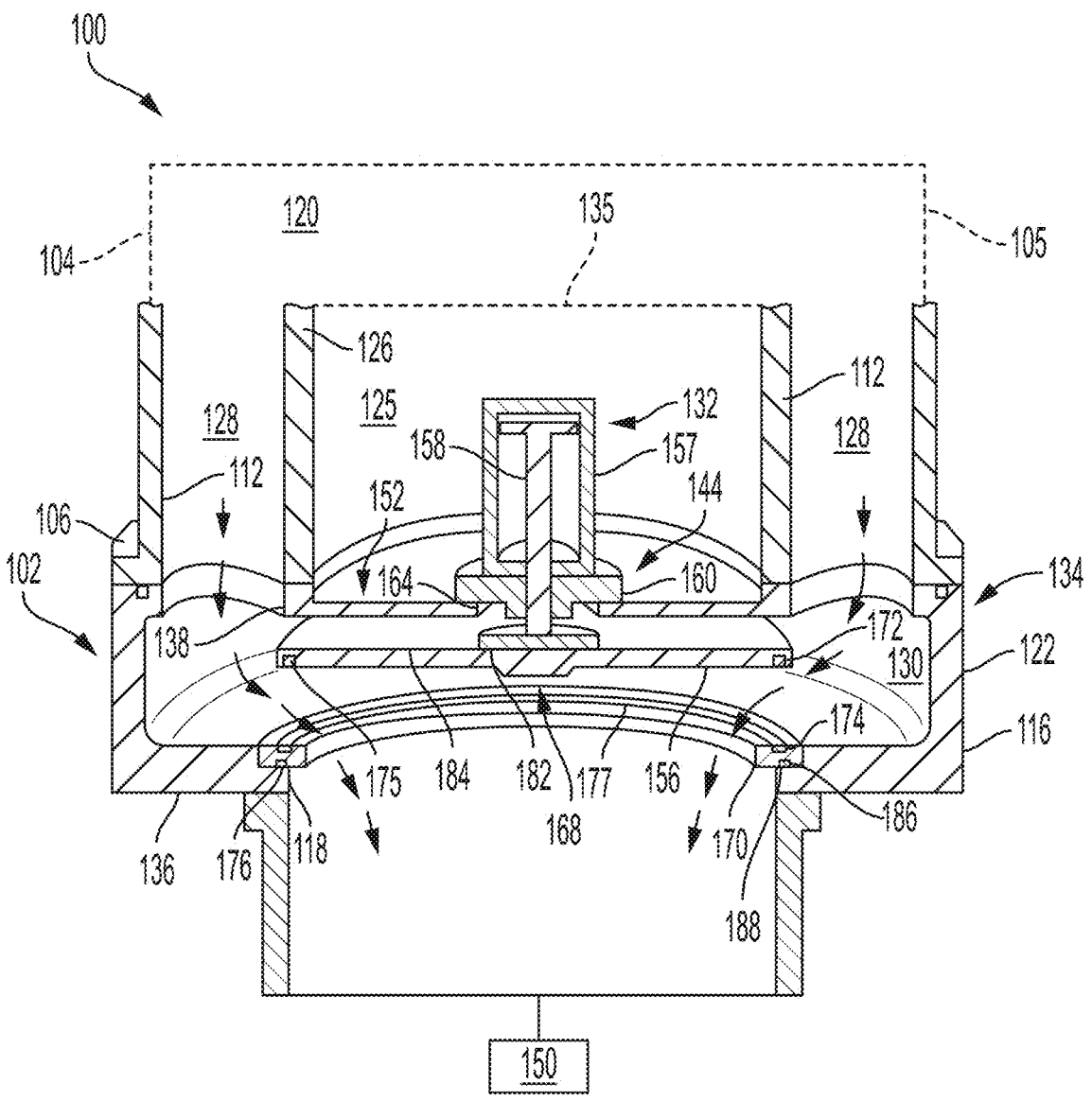
FIG. 1 depicts a schematic cross-sectional side view of a substrate processing chamber having a symmetric flow valve in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of improved symmetric flow valves for use in substrate processing chambers are provided herein. The symmetric flow valve is disposed between the substrate processing chamber and a pump, such as a turbopump. The symmetric flow valve generally includes a poppet disposed in an interior volume of a valve body of the symmetric flow valve. The poppet is coupled to an actuator to raise or lower the poppet to selectively open or close one or more openings of the valve body to regulate pressure and flow in the substrate processing chamber. The actuator is centrally located above the valve body so that a shaft of the actuator extends to and is coupled to a central region of the poppet.

The actuator centrally located above the valve body provides a more direct coupling to the poppet without requiring an arm or other asymmetrically disposed components extending across the interior volume therebetween, resulting in less obstruction in a flow path through the valve body and more uniform flow within the interior volume. Also, particles deposited on the arms or other components may tend to back flow into the substrate processing chamber when the arm or other components move up and down in the interior volume. The actuator being located above the valve body also improves the serviceability of the pump as compared to conventional processing chambers having actuators that are coupled to a sidewall or bottom of the valve body. Thus, the actuator being located above the valve body and coupled to a central region of the poppet advantageously improves flow conductance and uniformity through the valve body, reduces contamination, and improves serviceability.

FIG. 1 depicts a schematic cross-sectional side view of a substrate processing chamber 100 having a symmetric flow valve 102 in an open position in accordance with at least some embodiments of the present disclosure. The substrate processing chamber 100 may generally be an etching chamber, a physical vapor deposition chamber, or a chemical vapor deposition chamber. However, other types of substrate processing chambers configured for different processes can also use or be modified to use embodiments of the symmetric flow valve described herein.

The substrate processing chamber generally includes a chamber body 104 coupled to a symmetric flow valve 102. The symmetric flow valve 102 is disposed between the chamber body 104 and a pump 150. The chamber body 104 has sidewalls 105 coupled to a floor 106 for defining an interior volume 120 therein. The floor 106 includes a plurality of chamber openings 112 for exhausting the interior volume 120. In some embodiments, each of the plurality of chamber openings 112 is coupled to an exhaust volume 128. In some embodiments, the exhaust volume 128 is a portion of the interior volume 120 defined by the sidewalls 105 of the chamber body 104 and an inner wall 126 disposed radially inward of the sidewalls 105. In some embodiments, a cover plate 135 is coupled to the inner wall 126 to define a plenum 125 radially inward of the inner wall 126 and fluidly isolated from the interior volume 120. The plurality of chamber openings 112 may correspond with a size and shape of a plurality of axisymmetrically disposed openings 138 of the symmetric flow valve 102.

The symmetric flow valve 102 includes a valve body 116 having sidewalls 122, a bottom plate 136, and a top plate 134 that together define an interior volume 130 therein. The top plate 134 includes the plurality of axisymmetrically disposed openings 138 arranged in a non-linear manner. In some embodiments, the plurality of chamber openings 112 have a size and shape that corresponds with the plurality of axisymmetrically disposed openings 138. The bottom plate 136 includes a port opening 118. In use, flow from the exhaust volume 128 enters the valve body 116 via the plurality of axisymmetrically disposed openings 138 and exits the valve body 116 via the port opening 118. A pump 150 is coupled to the port opening 118 and configured to evacuate or regulate the pressure of the interior volume 120. The pump 150 may comprise a turbopump suitable for pumping greater than about 2000 liters per second through the symmetric flow valve 102.

An actuator 132 is disposed above the top plate 134 and coupled to a central region 144 of the top plate 134. The central region 144 is disposed radially inward of the plurality of axisymmetrically disposed openings 138. In some embodiments, the actuator 132 is disposed in the plenum 125. In some embodiments, the top plate 134 includes a central recess 152 and the actuator 132 is coupled to the central recess 152. The central recess 152 advantageously provides more space for the actuator 132 in the plenum 125. In some embodiments, the actuator 132 is a linear actuator. The linear actuator may be actuated via a suitable power source, for example, electrical, hydraulic, pneumatic, or the like. For example, the actuator 132 may include a housing 157 and a shaft 158 disposed in and vertically movable with respect to the housing 157. In some embodiments, the shaft 158 is vertically movable as a screw-type actuator. In some embodiments, the actuator 132 is coupled to the top plate 134 via a flange 160. In some embodiments, an outer diameter of the flange 160 is greater than a diameter of an opening 164 of the top plate 134 for accommodating the shaft 158 therethrough.

A poppet 156 is disposed in the interior volume 130 and coupled to the shaft 158 of the actuator 132 to move the poppet 156 vertically within the interior volume 130. In some embodiments, shaft 158 is coupled to a center 168 of the poppet 156 to provide a symmetrical flow path within the interior volume 130. The poppet 156 is configured to selectively seal the plurality of axisymmetrically disposed openings 138 or the port opening 118. In some embodiments, as shown in FIG. 1, the poppet 156 is configured to selectively seal the port opening 118 and comprises a plate having no through holes. In some embodiments, a radially outermost surface of the poppet 156 is disposed radially inward of the plurality of axisymmetrically disposed openings 138.

In some embodiments, the poppet 156 includes a backing plate 182 coupled to an upper surface 184 of the poppet 156 configured to aid in coupling the poppet 156 to the shaft 158 and to provide additional structural support. In some embodiment, the poppet 156 may include a through hole at an interface between the actuator 132 and the poppet 156 for facilitate coupling the poppet 156 to the actuator 132 and may comprise a plate having no through holes radially outward of the interface between the poppet 156 and the actuator 132.

In some embodiments, a seal ring 170 is disposed on or coupled to the bottom plate 136 about the port opening 118 to provide a seal between the poppet 156 and the port opening 118. In some embodiments, the poppet 156 includes an o-ring groove 172 in a lower surface of the poppet 156 for accommodating an o-ring 175 configured to provide a seal between the poppet 156 and the seal ring 170. In some embodiments, the seal ring 170 includes an o-ring groove 174 along an upper surface of the seal ring 170 for accommodating an o-ring seal area 177 configured to provide a seal between the poppet 156 and the seal ring 170. In some embodiments, the o-ring 175 is aligned with the o-ring seal area 177 and in contact with each other when the poppet 156 is in a closed position. In some embodiments, the seal ring 170 includes a lower o-ring groove 186 disposed along a lower surface of the seal ring 170 for housing an o-ring 188 configured to sealingly engaged the bottom plate 136. In some embodiments, the seal ring 170 is coupled to a notched surface 176 formed in the bottom plate 136 about the port opening 118. In some embodiments, the seal ring 170 extends radially inward of sidewalls formed by the port opening 118.

In the embodiment shown in FIG. 1, in use, when in the open position, the poppet 156 allows air flow between the poppet 156 and the seal ring 170. When in the closed position, the poppet 156 sealingly engages with the seal ring 170 and prevents air flow therethrough to the port opening 118.

Figure 2:
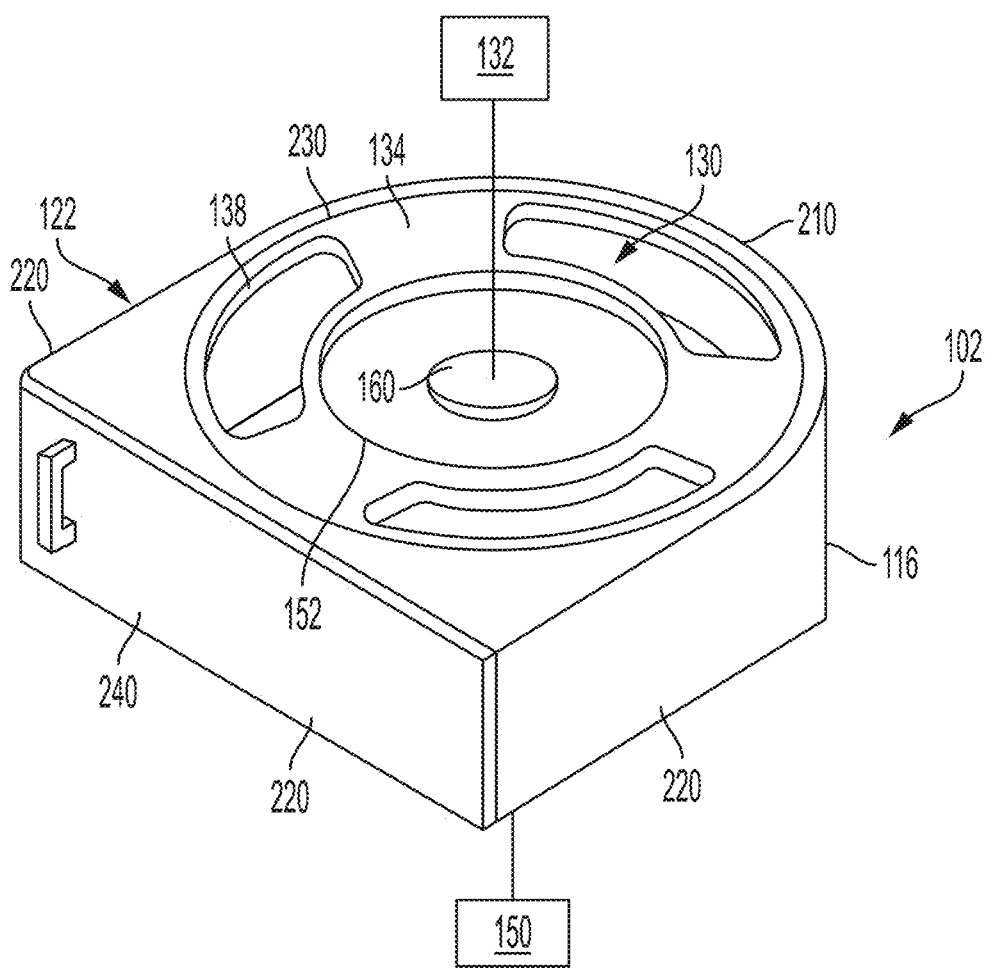
FIG. 2 depicts a top isometric view of a symmetric flow valve in accordance with at least some embodiments of the present disclosure.

FIG. 2 depicts a top isometric view of a symmetric flow valve 102 in accordance with at least some embodiments of the present disclosure. In some embodiments, the sidewalls 122 of the valve body 116 comprise one or more rounded walls 210 and a plurality of linearly extending walls 220. For example, as depicted in FIG. 2, the sidewalls 122 comprise three linearly extending walls forming three walls of a square like structure and one rounded wall connected to ends of two of the linearly extending walls. In some embodiments, one of the sidewalls 122 comprises a service cover 240 configured to permit access to the interior volume 130 for servicing the symmetric flow valve 102.

In some embodiments, the plurality of chamber openings 112 are arc shaped openings. In some embodiments, an annular o-ring groove 230 is disposed in the top plate 134 radially outward of the plurality of axisymmetrically disposed openings 138. The annular o-ring groove 230 may house an o-ring for sealingly engaging the top plate 134 with the floor 106 of the chamber body 104.

Figure 3:
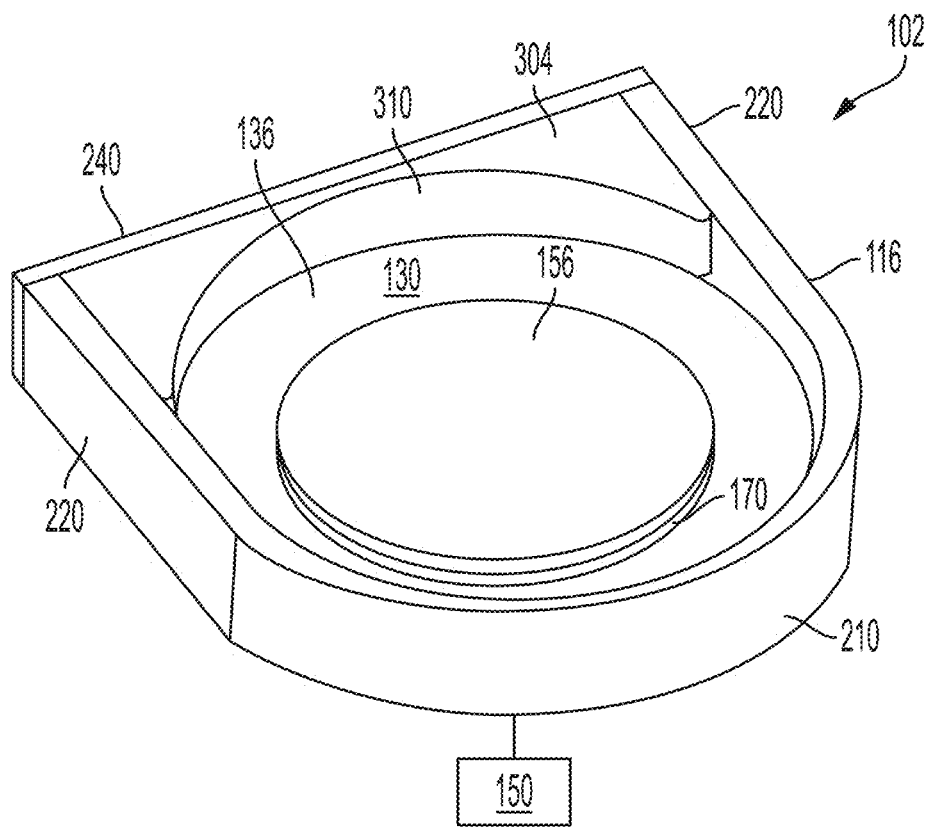
FIG. 3 depicts a top isometric view of a symmetric flow valve in accordance with at least some embodiments of the present disclosure.

FIG. 3 depicts a top isometric view of a symmetric flow valve 102 in accordance with at least some embodiments of the present disclosure. The symmetric flow valve 102 in FIG. 3 is depicted without the top plate 134 and the actuator 132. In some embodiments, a shape of the interior volume 130 is different than a shape of the exterior surfaces of the valve body 116. For example, the sidewalls 122 of the valve body 116 may include the one or more rounded walls 210 and the plurality of linearly extending walls 220, while the interior volume 130 has a circular shaped profile. The service cover 240 may be coupled to a block 304 extending between opposing ones of the plurality of linearly extending walls 220. The block 304 may at least partially define the interior volume 130. For example, the block 304 may include a curved surface 310 facing the interior volume 130 such that the interior surfaces of the sidewalls 122 and the curved surface 310 define a cylindrical or near cylindrical shape of the interior volume 130.

Figure 4:
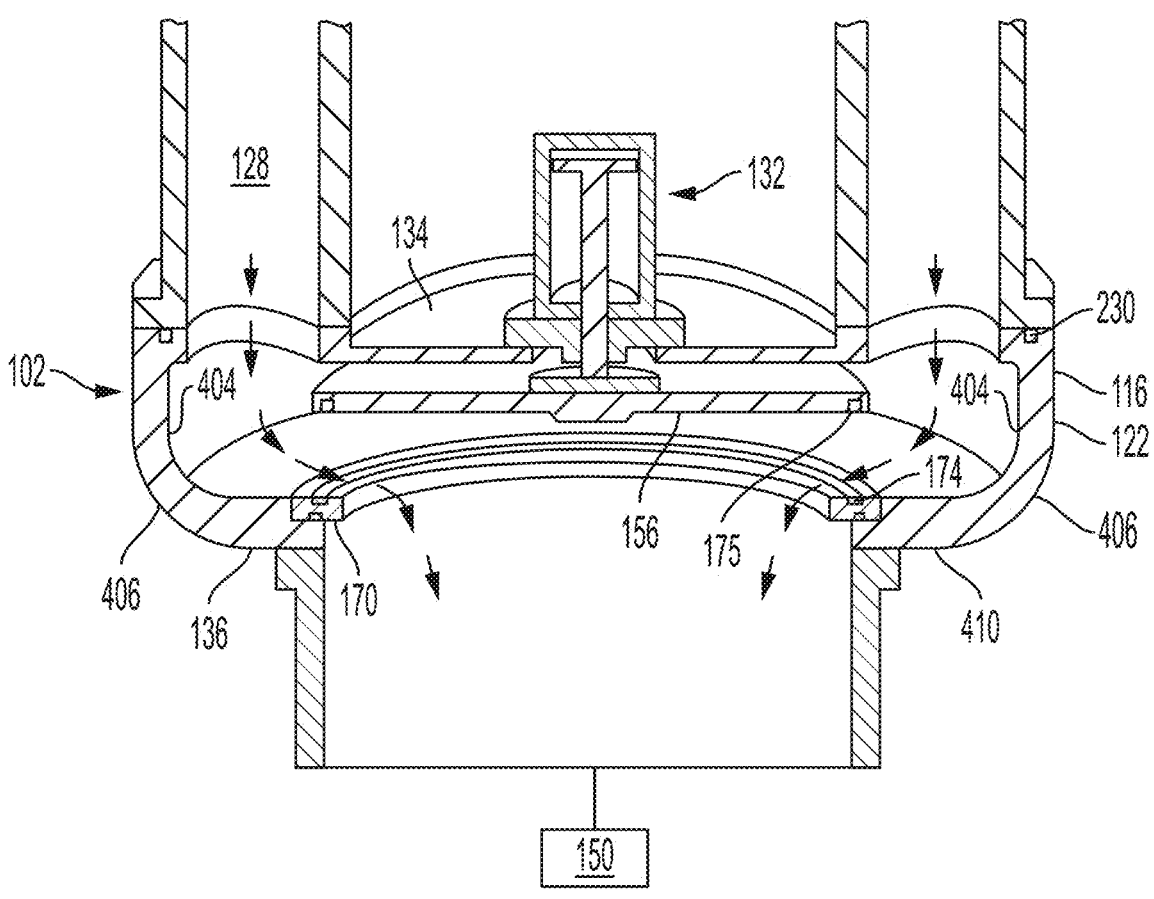
FIG. 4 depicts a schematic cross-sectional side view of a substrate processing chamber having a symmetric flow valve in accordance with at least some embodiments of the present disclosure.

FIG. 4 depicts a schematic cross-sectional side view of a substrate processing chamber having a symmetric flow valve in an open position in accordance with at least some embodiments of the present disclosure. In some embodiments, the interior surfaces 404 of the sidewalls 122 of the valve body 116 are more rounded proximate the bottom plate 136 than proximate the top plate 134 to reduce areas of stagnant flow in a corner region between the bottom plate 136 and the sidewalls 122. In some embodiments, exterior surfaces 406 of the sidewalls 122 are rounded corresponding to the rounded interior surfaces 404. In some embodiments, the exterior surfaces 406 are rounded such that there is a substantially smooth transition from the exterior surfaces 406 of the sidewalls 122 to a lower surface 410 of the bottom plate 136.

Figure 5:
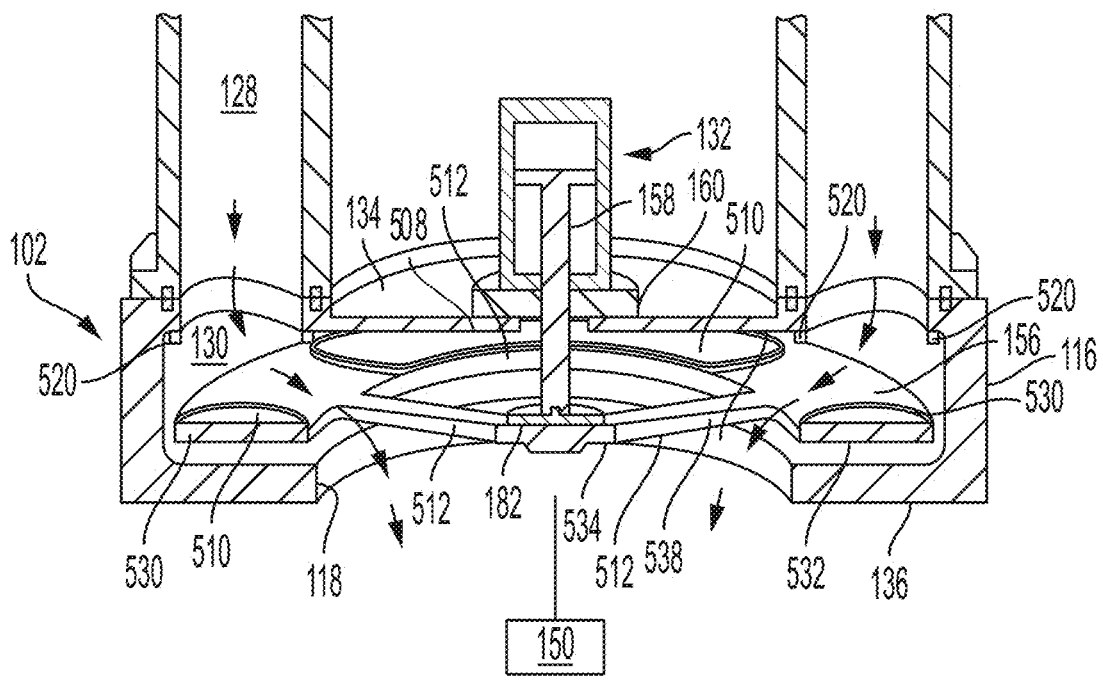
FIG. 5 depicts a schematic cross-sectional side view of a substrate processing chamber having a symmetric flow valve in accordance with at least some embodiments of the present disclosure.

FIG. 5 depicts a schematic cross-sectional side view of a substrate processing chamber having a symmetric flow valve 102 in accordance with at least some embodiments of the present disclosure. In some embodiments, the poppet 156 is configured to selectively seal the plurality of axisymmetrically disposed openings 138. In such embodiments, the poppet 156 is in a closed position when raised and an open position when lowered within the interior volume 130.

In some embodiments, the poppet 156 includes a plurality of raised portions 510 corresponding to the plurality of axisymmetrically disposed openings 138. In some embodiments, the plurality of raised portions 510 sealingly engage with the plurality of axisymmetrically disposed openings 138 in a suitable manner. For example, a lower surface 508 of the top plate 134 may include protrusions 520 extending about each of the plurality of axisymmetrically disposed openings 138 that are configured to engage with a seal 530 disposed about each of the plurality of raised portions 510. In some embodiments, the lower surface 508 of the top plate 134 includes o-ring grooves disposed about each of the plurality of axisymmetrically disposed openings 138 for housing o-rings that engage with the seal 530 about each of the plurality of raised portions 510.

In some embodiments, where the poppet 156 is configured to sealingly engage with the plurality of axisymmetrically disposed openings 138, the poppet 156 includes openings 512 for providing a flow path therethrough to the port opening 118. In some embodiments, the poppet 156 includes an outer ring 532, an inner plate 534, and a plurality of spokes 538 connecting the outer ring 532 to the inner plate 534. In some embodiments, the shaft 158 of the actuator 132 is coupled to the poppet 156 at the inner plate 534.

While the foregoing is directed to embodiments of the present disclosure, other and further embodiments of the disclosure may be devised without departing from the basic scope thereof.

The invention claimed is:

1. A symmetric flow valve for use in a substrate processing chamber, comprising:

a valve body having sidewalls, a bottom plate coupled to the sidewalls, and a top plate coupled to the sidewalls, wherein the sidewalls, the bottom plate, and the top plate together define an interior volume, wherein the top plate sits atop the sidewalls and includes a plurality of axisymmetrically disposed openings arranged in a non-linear manner, wherein the plurality of axisymmetrically disposed openings are arc shaped openings, and wherein the bottom plate includes a port opening;

an actuator disposed above the top plate and coupled to a central region of the top plate radially inward of the plurality of axisymmetrically disposed openings; and a poppet disposed in the interior volume and coupled to the actuator to move the poppet vertically within the interior volume, wherein the poppet is configured to selectively seal the port opening, and wherein the plurality of axisymmetrically disposed openings are disposed radially outward of the poppet.

2. The symmetric flow valve of claim 1, wherein the top plate includes a central recess, and the actuator is coupled to the central recess, and further comprising a flange disposed in the central recess and coupled to the top plate between the actuator and the top plate.

3. The symmetric flow valve of claim 1, wherein the sidewalls include a service cover and a block coupled to the service cover to at least partially define the interior volume.

4. The symmetric flow valve of claim 3, wherein the sidewalls, including the block, define a cylindrically-shaped interior volume.

5. The symmetric flow valve of claim 1, wherein the poppet is configured to selectively seal the port opening, and wherein the poppet comprises a plate having no through holes radially outward of an interface between the actuator and the poppet.

6. The symmetric flow valve of claim 5, further comprising a seal ring disposed about the port opening, wherein at least one of the seal ring or the poppet includes an o-ring groove for accommodating an o-ring configured to provide a seal between the poppet and the seal ring.

7. A symmetric flow valve for use in a substrate processing chamber, comprising:

a valve body having sidewalls, a bottom plate, and a top plate that together define an interior volume, wherein exterior surfaces of the sidewalls comprise one or more rounded walls and a plurality of linearly extending walls, wherein the plurality of linearly extending walls are linear along a vertical direction and a horizontal direction, wherein the top plate includes a plurality of axisymmetrically disposed openings arranged in a non-linear manner, and wherein the bottom plate includes a port opening;

an actuator disposed above the top plate and coupled to a central region of the top plate radially inward of the plurality of axisymmetrically disposed openings; and a poppet disposed in the interior volume and coupled to a shaft of the actuator at a center of the poppet to move the poppet vertically within the interior volume, wherein the poppet is configured to selectively seal the plurality of axisymmetrically disposed openings or the port opening, and wherein the interior volume is asymmetrical about the shaft.

8. The symmetric flow valve of claim 7, wherein the poppet is configured to selectively seal the plurality of axisymmetrically disposed openings, and wherein the poppet includes a plurality of raised portions corresponding to the plurality of axisymmetrically disposed openings.

9. The symmetric flow valve of claim 8, wherein a lower surface of the top plate includes a protrusion disposed about each of the plurality of axisymmetrically disposed openings and configured to engage with a seal disposed about each of the plurality of raised portions.

10. The symmetric flow valve of claim 7, wherein the poppet is configured to selectively seal the plurality of axisymmetrically disposed openings, wherein the poppet includes an outer ring, and inner plate, and a plurality of spokes connecting the outer ring to the inner plate, wherein the shaft of the actuator is coupled to the poppet at the inner plate.

11. The symmetric flow valve of claim 7, wherein interior surfaces of the sidewalls are more rounded proximate the bottom plate than proximate the top plate to reduce areas of stagnant flow.

12. The symmetric flow valve of claim 7, further comprising an annular o-ring groove disposed in the top plate radially outward of the plurality of axisymmetrically disposed openings.

13. The symmetric flow valve of claim 12, wherein the poppet is configured to selectively seal the port opening, and wherein the poppet comprises a plate having no through holes.

14. The symmetric flow valve of claim 7, wherein the symmetric flow valve is coupled to a substrate processing chamber.

15. A substrate processing chamber, comprising:

a chamber body having a floor, wherein the floor includes a plurality of chamber openings;

a valve body having sidewalls, a bottom plate, and a top plate that together define an interior volume, wherein the top plate includes a plurality of axisymmetrically disposed openings arranged in a non-linear manner corresponding with the plurality of chamber openings, and wherein the bottom plate includes a port opening;

an actuator disposed above the top plate and coupled to a central region of the top plate radially inward of the plurality of axisymmetrically disposed openings; and a poppet disposed in the interior volume and coupled to the actuator to move the poppet vertically within the interior volume, wherein the poppet is configured to selectively seal the plurality of axisymmetrically disposed openings or the port opening.

16. The substrate processing chamber of claim 15, wherein the sidewalls comprise one or more rounded walls and a plurality of linearly extending walls.

17. The substrate processing chamber of claim 15, wherein the plurality of chamber openings are arc shaped openings.

18. The substrate processing chamber of claim 15, wherein the poppet is configured to selectively seal the port opening, and wherein the poppet comprises a plate having no through holes, and wherein an outermost surface of the poppet is disposed radially inward of the plurality of axisymmetrically disposed openings.

19. The substrate processing chamber of claim 15, wherein the poppet is configured to selectively seal the plurality of axisymmetrically disposed openings, wherein the poppet includes an outer ring, and inner plate, and a plurality of spokes connecting the outer ring to the inner plate, wherein a shaft of the actuator is coupled to the poppet at the inner plate.

* * * * *